(12) United States Patent
Horiuchi et al.

(10) Patent No.: US 6,377,139 B1
(45) Date of Patent: Apr. 23, 2002

(54) EDGE REFLECTION TYPE SURFACE ACOUSTIC WAVE DEVICE WITH GROOVES OR STEPS AT THE REFLECTION EDGES

(75) Inventors: Hideya Horiuchi; Michio Kadota, both of Kyoto; Junya Ago; Takao Mukai, both of Nagaokakyo, all of (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 09/521,829

(22) Filed: Mar. 9, 2000

(30) Foreign Application Priority Data

Mar. 19, 1999 (JP) .............................. 11-075976

(51) Int. Cl.⁷ ............................. H03H 9/25; H03H 9/64
(52) U.S. Cl. ................... 333/193; 333/195; 310/313 B
(58) Field of Search ................................. 333/193–196; 310/313 R, 313 B, 313 C, 313 D (56) References Cited

U.S. PATENT DOCUMENTS

| | | | |
|---|---|---|---|
| 5,184,042 A | * 2/1993 | Kadota et al. | 333/313 B X |
| 5,260,913 A | * 11/1993 | Kadota et al. | 310/313 B X |
| 5,793,147 A | * 8/1998 | Kadota et al. | 310/313 B X |
| 5,838,217 A | * 11/1998 | Kadota et al. | 333/193 |
| 5,952,899 A | * 9/1999 | Kadota et al. | 333/193 |
| 6,150,900 A | * 11/2000 | Kadota et al. | 333/193 X |

FOREIGN PATENT DOCUMENTS

| | | |
|---|---|---|
| JP | 7-263998 | 10/1995 |
| JP | 9-294045 | * 11/1997 |
| JP | 9-326373 | 12/1997 |

* cited by examiner

Primary Examiner—Robert Pascal
Assistant Examiner—Barbara Summons
(74) Attorney, Agent, or Firm—Keating & Bennett, LLP (57) ABSTRACT

An edge reflection type surface acoustic wave device utilizes a Shear Horizontal type surface acoustic wave and includes a surface acoustic wave substrate, and at least two interdigital transducers provided on one main surface of the surface acoustic wave substrate. First and second grooves are formed on the opposite ends in the surface acoustic wave propagation direction of the area where the interdigital transducer is provided. The first and second grooves extend from the one main surface of the surface acoustic wave substrate toward the other main surface thereof without reaching the other main surface. The grooves extend substantially perpendicularly to the surface acoustic wave propagation direction so as to define first and second edges for reflecting the surface acoustic wave. The first and second edges are defined by the inner sideively. walls of the first and second grooves, respectively.

16 Claims, 9 Drawing Sheets

EDGE REFLECTION TYPE SURFACE ACOUSTIC WAVE DEVICE WITH GROOVES OR STEPS AT THE REFLECTION EDGES

BACKGROUND OF THE INVENTION

1. Field of the Invention

The present invention relates to a surface acoustic wave device for use as a resonator or a band filter in communication devices or other apparatuses, and more particularly, the present invention relates to an edge reflection type surface acoustic wave device which utilizes an SH type surface acoustic wave.

2. Description of the Related Art

Edge reflection type surface acoustic wave devices which utilize an SH type surface acoustic wave such as a BGS (Bleustein-Gulyaev-Shimizu) wave, a Love wave, or other such waves are known. In an edge reflection type surface acoustic wave device, edges are formed which are on the opposite ends in the surface acoustic wave propagation direction of the area where an interdigital transducer (IDT) is provided, and the edges are perpendicular to the surface acoustic wave propagation direction. A surface acoustic wave is reflected by the edges. Accordingly, reflectors are not necessary and as a result, the surface acoustic wave device can be miniaturized.

Figure 7:
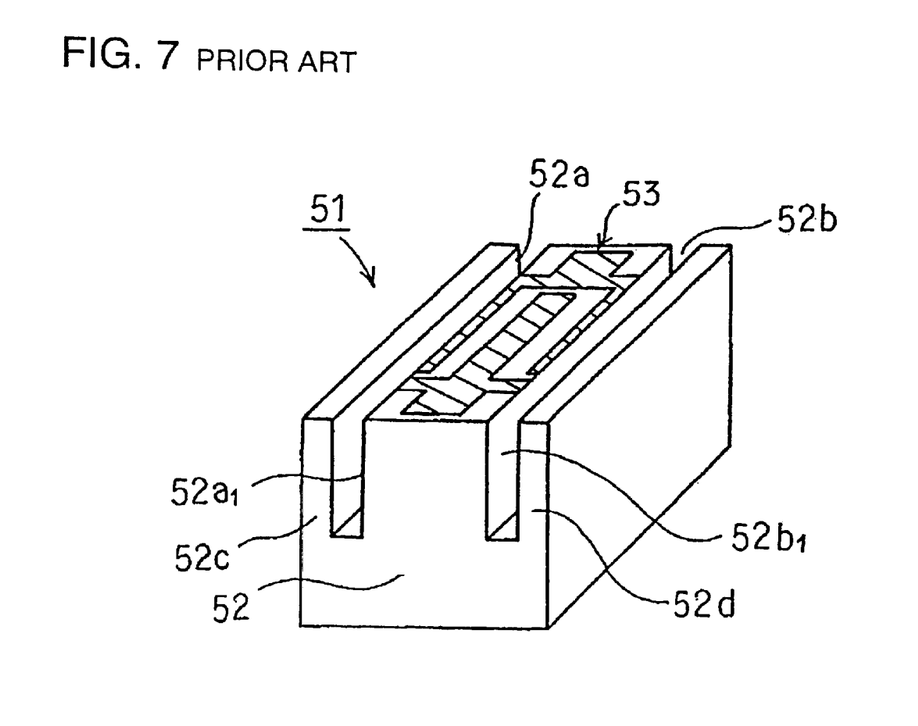
FIG. 7 is a perspective view showing an example of a conventional edge reflection type surface acoustic wave resonator.

Japanese Unexamined Patent Publication No. 7-263998 discloses an edge reflection type surface acoustic wave resonator in which grooves are formed on a surface acoustic wave substrate, and the inner side walls of the grooves constitute the reflection edges. As shown in FIG. 7, in an edge reflection type surface acoustic wave resonator 51, an IDT 53 is formed on a surface acoustic wave substrate 52. On the opposite ends in the surface acoustic wave propagation direction of the IDT 53, grooves 52a and 52b are formed. The inner side walls $52a_1$ and $52b_1$ of the grooves 52a and 52b constitute the reflection edges.

The inner side walls $52a_1$ and $52b_1$ of the grooves 52a and 52b are used as the reflection edges because the stability of mounting is improved. In the edge reflection type surface acoustic wave resonator 51, only one IDT 53 is provided. When the number of pairs of the electrode fingers of the IDT 53 is small, the chip size in the surface acoustic wave propagation direction is very small, so that the mounting stability is deteriorated. Accordingly, substrate portions 52c and 52d are formed on the outer sides of the inner side walls $52a_1$ and $52b_1$ constituting the reflection edges, and thereby, the chip size is increased in the surface acoustic wave propagation direction, so that the mounting stability is improved.

Figure 8:
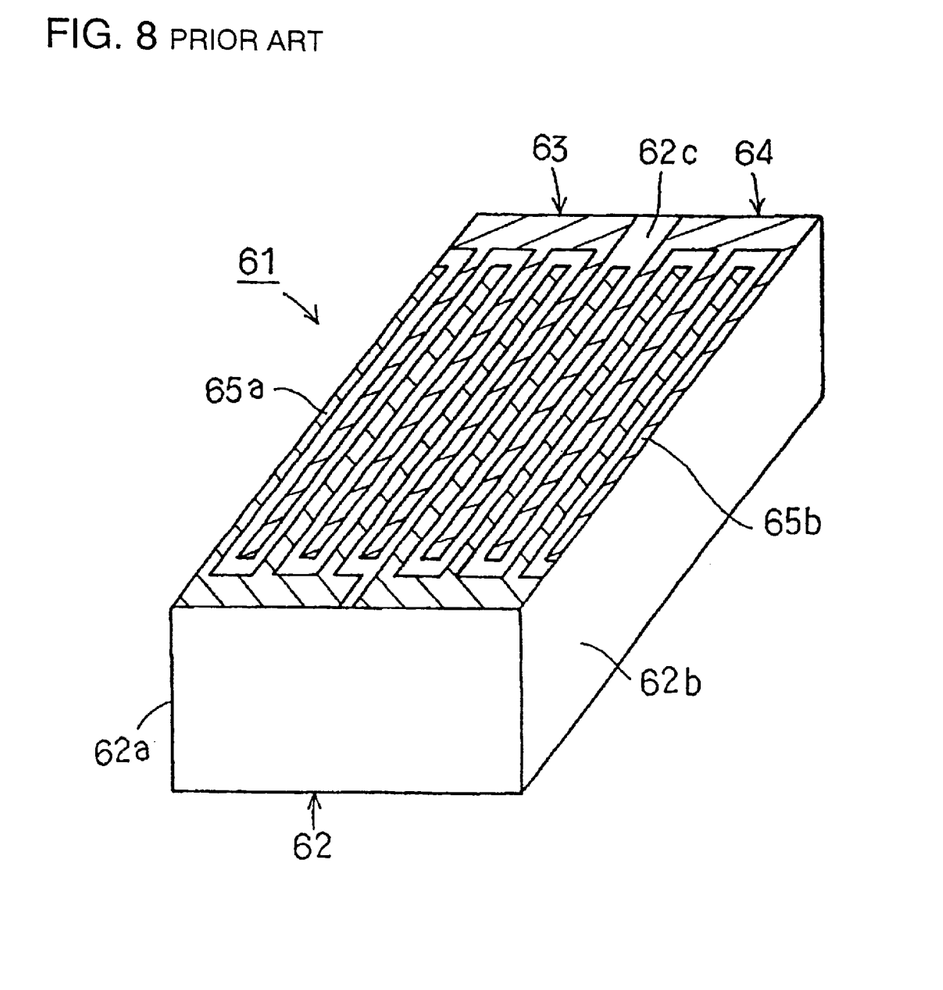
FIG. 8 is a perspective view showing an example of a conventional edge reflection longitudinally coupled SAW type resonator filter.

On the other hand, there are some edge reflection type surface acoustic wave devices which have a relatively large number of electrode finger pairs such as an edge reflection type longitudinally coupled SAW resonator filter having a plurality of IDTs. For example, as shown in FIG. 8, in an edge reflection type longitudinally coupled SAW resonator filter 61, two IDTs 63 and 64 are formed on a surface acoustic wave substrate 62. In this case, since the IDTs 63 and 64 are provided, the number of electrode fingers is relatively large, and thereby, the distance between the side surfaces 62a and 62b of the surface acoustic wave substrate 62 is relatively large. Thus, the chip size measured in the surface acoustic wave propagation direction is sufficiently large, and thereby, the mounting stability is high.

That is, for an edge reflection type longitudinally coupled SAW resonator filter, it is not necessary to form the substrate portions 52c and 52d on the outer sides of the grooves 52a and 52b, respectively, in contrast to the surface acoustic wave resonator 51 shown in FIG. 7. If the substrate portions 52c and 52d are provided, they will prevent miniaturization without serving any useful purpose.

In the edge reflection type surface acoustic wave device, the electrode fingers of the IDTs 63 and 64 are located near the side surfaces 62a and 62b, similarly to the edge reflection type longitudinally coupled SAW resonator filter 61. That is, the electrode fingers 65a and 65b located at the outermost ends in the surface acoustic wave propagation direction are formed along the edges defined by the side surfaces 62a, 62b and the upper surface 62c, respectively.

Referring to the production of the SAW resonator filter 61, the IDTs 63 and 64 are formed on a mother surface acoustic wave substrate, and thereafter, the surface acoustic wave substrate is cut in the thickness direction to form the side surfaces 62a and 62b. The side surfaces 62a and 62b should be formed with high precision, since the edges defined by the side surfaces 62a, 62b reflect a surface acoustic wave. In addition, since the electrode fingers 65a and 65b are located near the edges 62a and 62b, respectively, chipping at the surface of the surface acoustic wave substrate 62 which is caused during cutting of the substrate 62 should be prevented as much as possible. If the chipping and the breaking of a substrate material is increased, the electrode fingers 65a and 65b will be disconnected, which will considerably affect the filter characteristics.

Such problems as described above arise not only in the edge reflection type longitudinally coupled type SAW resonator filter 61 but also in other edge reflection type surface acoustic wave devices such as an edge reflection type surface acoustic wave resonator.

On the other hand, Japanese Unexamined Patent Publication No. 9-326373 discloses a method of preventing the chipping of a substrate, which occurs during cutting of a semiconductor wafer or other such component. In particular, as the method of cutting a substrate, a bevel cutting method illustrated in FIG. 9A, and a step cutting method shown in FIG. 9B are described.

Figure 9A:
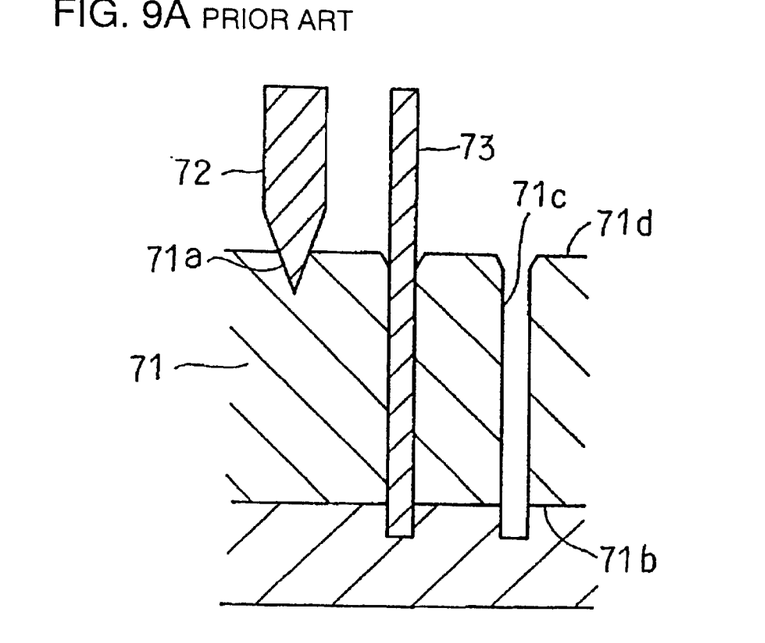
FIGS. 9A and 9B are schematic cross sections each illustrating a method of cutting a surface acoustic wave substrate.

As shown in FIG. 9A, according to the bevel cutting method, first, a V-shaped groove 71a is formed on a substrate 71 via a blade 72 having a V-shaped cross-section. Next, the portion of the substrate 71 where the V-shaped groove 71a is formed is cut via another cutting blade 73 so that the groove extends to and reaches the lower major surface 71b of the substrate 71. According to this method, when the cutting is performed via the blade 73, chipping at the edge defined by the upper surface 71d and the side 71c of the substrate 71 is prevented, since the V-shaped groove 71a is previously formed.

Figure 9B:
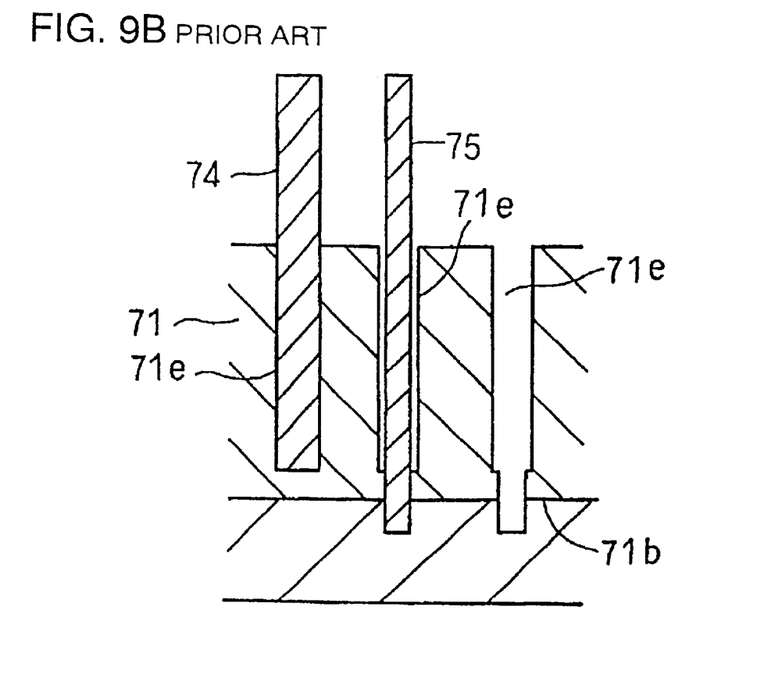

Further, according to the step cutting method shown in FIG. 9B, first, the substrate 71 is imperfectly cut via a cutting blade 74 having a relatively wide cutting width to form a groove 71e such that a small cutting margin is left. Next, cutting is performed in the groove 71e with a blade 75 having a relative narrow cutting width, so that the groove extends to and reaches the lower surface of the substrate 71. In this case, the second cutting step can be easily performed, since the cutting is carried out from the bottom of the groove 71e to the lower surface 71b of the substrate 71 via the blade 75. Thus, chipping at the lower surface 71b of the substrate 71 can be prevented.

However, in an edge reflection type surface acoustic wave device, when reflection edges are formed by cutting, it is necessary not only to prevent the above-described chipping but also to form the reflection edges which are as vertical relative to the substrate as possible. Thus, according to the bevel cutting method, an inclined-surface portion is formed between the upper surface 71d of the substrate 71 where the IDT is formed and the side surface 71c thereof, which is caused by the V-shaped groove 71a. Therefore, the verticality of the upper portion of the side is deteriorated.

On the other hand, the step cutting method is effective in preventing chipping at the lower surface of a substrate, but is not effective in preventing chipping at the upper surface of a substrate.

SUMMARY OF THE INVENTION

To overcome the problems described above, preferred embodiments of the present invention provide an edge reflection type surface acoustic wave device and a method of manufacturing thereof, in which reflection edges are formed with high precision so as to be perpendicular to a major surface of a surface acoustic wave substrate on which an IDT is provided, so as to prevent disconnection of an electrode finger caused by chipping and so that the surface acoustic wave device has excellent resonance characteristics and filter characteristics.

An edge reflection type surface acoustic wave device which utilizes an SH type surface acoustic wave according to a first preferred embodiment of the present application preferably includes a surface acoustic wave substrate, and at least two IDTs provided on one main surface of the surface acoustic wave substrate, wherein first and second grooves are formed on the opposite ends in the surface acoustic wave propagation direction of the area where the IDT is provided, so as to extend from the one main surface of the surface acoustic wave substrate toward the other main surface thereof while not reaching the other main surface and so as to extend substantially perpendicularly to the surface acoustic wave propagation direction, and first and second edges for reflecting the surface acoustic wave, the first and second edges being defined by the inner side walls of the first and second grooves, respectively.

The first and second grooves can be formed by cutting the surface acoustic wave substrate beginning from one main surface of the surface acoustic wave substrate and extending toward the other main surface of the surface acoustic wave substrate while not reaching the other main surface. Therefore, the grooves are formed with high precision substantially without chipping of the surface acoustic wave substrate and disconnection of the electrode fingers of the IDTs. Accordingly, an edge reflection type surface acoustic wave device having excellent resonance characteristics and filter characteristics is achieved.

When the electromechanical coupling coefficient of thickness shear vibration is represented by $k_{15}$, and the wavelength of a surface acoustic wave by $\lambda$, the first and second grooves are preferably formed so as to have a depth H satisfying the following formula (1):

$$0.2 \geq \exp(-2\pi k_{15}^2 H/\lambda) \tag{1}$$

It is further preferable that the depth H of each of the first and second grooves is not less than the wavelength 80, of a surface acoustic wave to be generated in the surface acoustic wave device.

In the case of the depth H of the first and second grooves formed so as to satisfy the formula (1), and in the case of the depth H of the grooves not less than the wavelength $\lambda$ of a surface acoustic wave, according to preferred embodiments of the present invention, most of the energy of the surface acoustic wave is reliably and securely reflected from the inner side walls of the grooves. Accordingly, an edge reflection type surface acoustic wave device having greatly improved resonance characteristics and filter characteristics is achieved.

According to the another preferred embodiment of the present invention, an edge reflection type surface acoustic wave device which utilizes an SH type surface acoustic wave, includes a surface acoustic wave substrate, and at least one IDT provided on the surface acoustic wave substrate, wherein steps are provided at the positions having an intermediate height of the first and second side surfaces positioned at the outer edges in the surface acoustic wave propagation direction of the surface acoustic wave substrate, respectively, and first and second edges for reflecting the surface acoustic wave are defined by the portions of the side surfaces located above the steps in the first and second side surfaces, respectively.

The above-described steps can be formed by cutting or splitting the portions below the bottoms of the grooves after the grooves are formed to extend from one main surface of the surface acoustic wave substrate without reaching the other main surface, respectively. Accordingly, during the formation of the grooves, chipping and the disconnection of the electrode fingers of the IDTs are reliably prevented. Thus, according to this preferred embodiment, an edge reflection type surface acoustic wave device having excellent resonance characteristics and filter characteristics is achieved.

When the electromechanical coupling coefficient of thickness shear vibration is represented by $k_{15}$, and the wavelength of a surface acoustic wave by $\lambda$, the first and second edges are preferably formed so as to have the distance D between the one main surface of the surface acoustic wave substrate and each of the steps, which satisfies the following formula (2).

$$0.2 \geq \exp(-2\pi k_{15}^2 D/\lambda) \tag{2}$$

In addition, it is preferable that the distance D between the one main surface of the surface acoustic wave substrate and each step is not less than the wavelength $\lambda$ of a surface acoustic wave.

When the distance D between the one main surface of the surface acoustic wave substrate and each step is formed so as to satisfy the formula (2), or when the distance D is not less than the wavelength $\lambda$ of a surface acoustic wave, most of the energy of the surface acoustic wave is reliably and securely reflected from the side surface portions located above the steps, respectively. Thus, an edge reflection type surface acoustic wave device having even more improved resonance characteristics and filter characteristics is achieved.

The unique features and structure of the edge reflection type surface acoustic wave devices described above can be applied to various edge reflection type surface acoustic wave devices such as an edge reflection type surface acoustic wave resonator, an edge reflection type surface acoustic wave filter, and other such devices.

For example, in the case of the longitudinally coupled type SAW resonator filter including the plural IDTs arranged in the surface acoustic wave propagation direction, a longitudinally coupled type SAW resonator filter having excellent filter characteristics is achieved. A transversely coupled resonator filter having excellent filter characteristics is achieved by arranging plural IDTs perpendicularly relative to the surface acoustic wave propagation direction.

Further, a ladder type filter having excellent filter characteristics is provided by forming plural IDTs on a single surface acoustic substrate to produce plural edge reflection type surface resonators, and electrically connecting the resonators via a connecting conducting part so as to form a ladder type filter.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
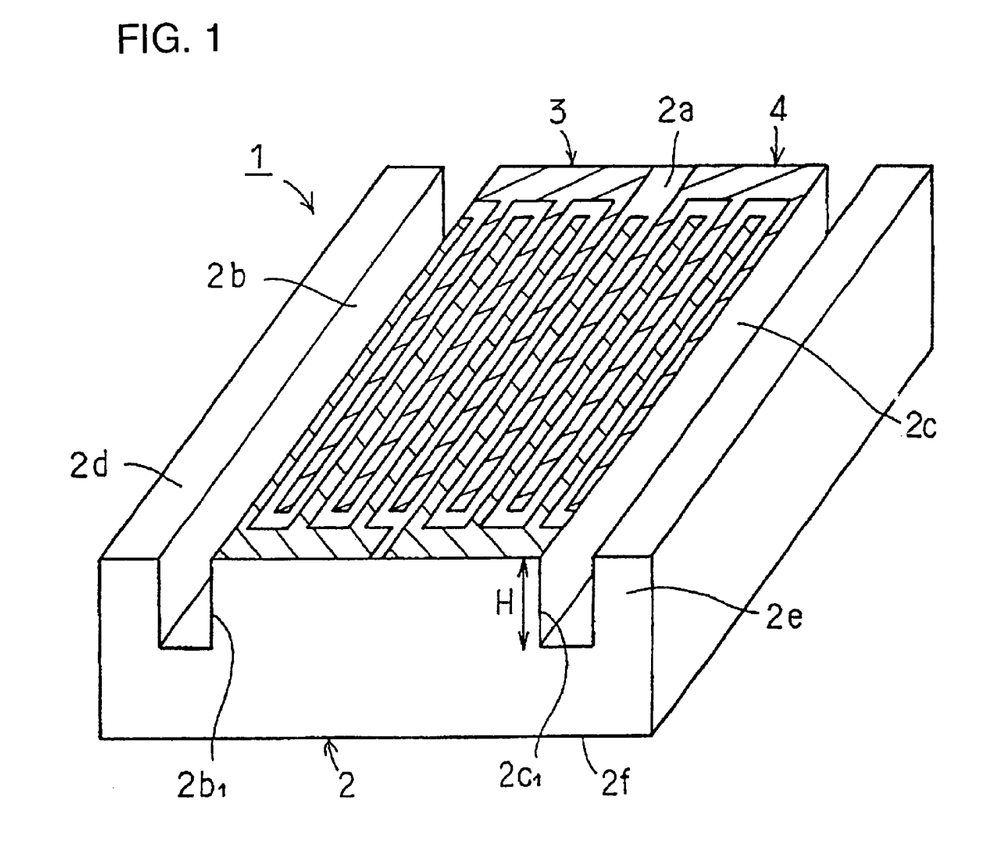
FIG. 1 is a perspective view showing an edge reflection type longitudinally coupled SAW resonator filter according to a first preferred embodiment of the present invention.

FIG. 1 is a perspective view showing an edge reflection type longitudinally coupled SAW resonator filter defining an edge reflection type surface acoustic wave device according to a first preferred embodiment of the present invention. A SAW resonator filter 1 preferably includes a substantially rectangular surface acoustic wave substrate 2. The surface acoustic wave substrate 2 is preferably made of a piezoelectric single crystal of $LiTaO_3$, $LiNbO_3$, quartz, or similar material, or a piezoelectric ceramic such as a lead titanate zirconate type ceramic or other suitable material. With a substrate 2 made of a piezoelectric ceramic, the substrate 2 is polarization-treated in the direction parallel to a direction along which the electrode fingers of the IDTs 3 and 4 extend.

Further, the surface acoustic wave substrate 2 may be formed by laminating a piezoelectric thin film such as a ZnO thin film onto an insulation substrate or a piezoelectric substrate. When the piezoelectric thin film is laminated, the IDTs 3 and 4 are formed on the upper surface or lower surface of the piezoelectric thin film.

The IDTs 3 and 4 are preferably formed on the upper surface 2a of the surface acoustic wave substrate 2. The IDTs 3 and 4 each contain a pair of interdigital electrodes. The electrode fingers of the pair of interdigital electrodes are arranged so as to be inserted between each other and to be interdigitated with each other. Further, the electrode fingers of the IDTs 3 and 4 extend perpendicularly to the surface acoustic wave propagation direction.

Grooves 2b and 2c are formed on the outer edges in the surface acoustic wave propagation direction of the IDTs 3 and 4. The inner side walls $2b_1$ and $2c_1$ of the grooves 2b and 2c constitute the reflection edges which the surface acoustic waves. For this reason, the inner side walls $2b_1$ and $2c_1$ are formed so as to accurately extend perpendicularly to the surface acoustic wave propagation direction.

Further, substrate portions 2d and 2e are provided on the outside of the grooves 2b and 2c.

The grooves 2b and 2c are formed by cutting the surface acoustic wave substrate 2 beginning from the upper surface 2a thereof and extending down toward the lower surface of the substrate 2 without actually reaching the lower surface of the substrate 2. In this case, preferably, the grooves 2b and 2c are formed so as to have a depth H, which satisfies the above-described formula (1), and thereby, excellent filter characteristics, described later, are achieved. Otherwise, the depth H of the grooves 2b and 2c is preferably not less than the wavelength $\lambda$ of the surface acoustic wave.

The grooves 2b and 2c are formed in the SAW resonator filter 1 not to improve the mounting stability of the resonator filter 1 but to improve the filter characteristics by preventing chipping. This will be described below.

When the edge reflection longitudinally coupled SAW resonator filter 1 is operated, an input voltage is applied to one IDT, e.g., the IDT 3, so that SH type surface acoustic waves are generated. The excited surface acoustic wave is propagated perpendicularly relative to the direction in which the electrode fingers of the IDTs 3 and 4 extend, that is, in the direction passing through the inner side walls $2b_1$ and $2c_1$ defining the reflection edges. The surface acoustic wave is reflected from the inner side walls $2b_1$ and $2c_1$, and further, the fundamental wave and the higher mode wave of the surface acoustic wave are combined, so that the standing wave is generated between the inner side walls $2b_1$ and $2c_1$. The output based on the standing wave is output from the IDT 4, whereby the filter 1 can be operated as a longitudinally coupled SAW resonator filter which utilizes the SH wave.

In the SAW resonator filter 1 according to preferred embodiments of the present invention, the reflection edges are defined by the inner side walls $2b_1$ and $2c_1$ of the grooves 2b and 2c. The formation of the grooves 2b and 2c can be performed via the step cutting method shown in FIG. 9(b). In particular, first, the IDTs 3 and 4 are formed on the surface acoustic wave substrate 2, and thereafter, the grooves 2b and 2c are formed via a cutting blade beginning from the upper surface 2a of the surface acoustic wave substrate 2. Regarding the formation of the grooves 2b and 2c, it is unnecessary to cut entirely through the surface acoustic wave substrate 2.

As described in Japanese Unexamined Patent Publication No. 9-326373 which is a conventional example, the step cutting method is effective in reducing chipping at the lower surface of the substrate. Further, since the surface acoustic wave substrate is not completely cut to the lower surface thereof, chipping at the upper surface 2a of the surface acoustic wave substrate 2 is decreased as compared with the case where the substrate is completely cut all the way through the substrate. Thus, the grooves 2b and 2c can be accurately formed while preventing chipping and preventing the disconnection of the electrode fingers.

In particular, in a conventional edge reflection type longitudinally coupled SAW resonator filter 61 shown in FIG. 8, for the formation of the side surfaces 62a, 62b, it is necessary to cut a surface acoustic wave substrate 62 completely from the upper surface to the lower surface. Therefore, there are tendencies for chipping to occur, for the electrode fingers to be disconnected, and for the filter characteristic to be deteriorated.

On the other hand, for the SAW resonator filter 1 of the present preferred embodiment of the present invention, it is not necessary to cut completely through the surface acoustic wave substrate from the upper surface 2a to the lower surface 2f. Therefore, the grooves 2b and 2c can be formed substantially without chipping and as a result, excellent filter characteristics are obtained.

Figure 2:
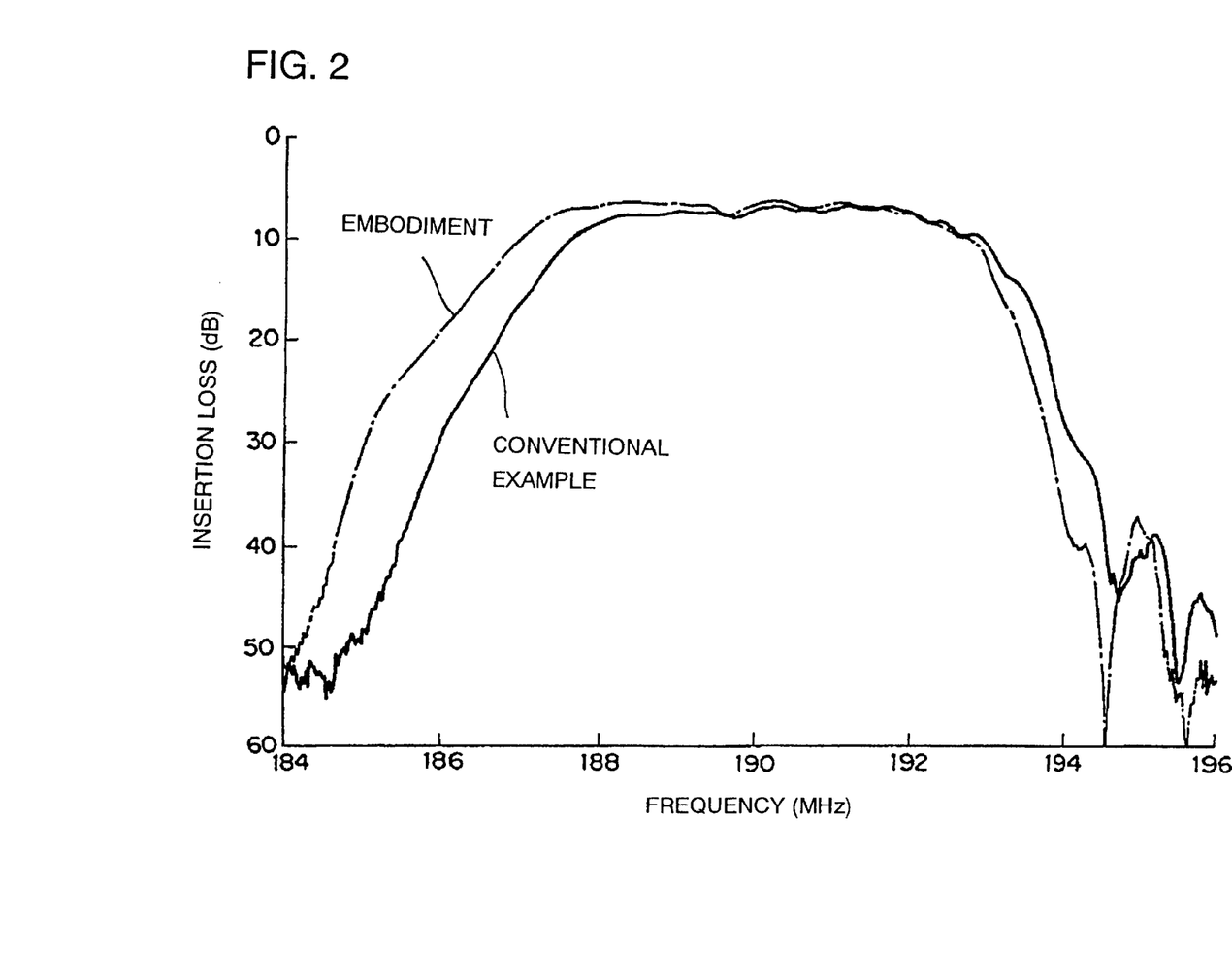
FIG. 2 is a graph showing the attenuation frequency characteristics of the SAW resonator filter according to the first preferred embodiment, and according to a conventional SAW resonator filter.

FIG. 2 shows the attenuation frequency characteristic of the longitudinally coupled SAW resonator filter 1 of this preferred embodiment and the attenuation frequency characteristic of the conventional edge reflection type longitudinally coupled SAW resonator filter 61. The results of the preferred embodiment are indicated by the alternate long and short dash line, and the results of the conventional example are shown by the continuous line.

Regarding the longitudinally coupled SAW resonator filter 1 of one of example of the preferred embodiments of the present invention, the surface acoustic wave substrate 2 is formed of LiTaO$_3$, the total number of the electrode finger pairs of the IDTs 3 and 4 is 34, the distance between the inner side-walls 2$b_1$ and 2$c_1$ of the grooves 2b and 2c is about 0.74 mm, and the depths of the grooves 2b and 2c are about 0.1 mm. On the other hand, the longitudinally coupled SAW resonator filter 61 defining the conventional example is formed similarly to the above-described preferred embodiment, except that the filter 61 has no grooves 2b, 2c and no substrate portions 2d, 2e.

The surfaces of the SAW resonator filters of the above-described preferred embodiment and the conventional example were analyzed. No chipping was found in the SAW resonator filter of the preferred embodiment of the present invention, while chipping was found in the SAW resonator filter 61 of the conventional example. As clearly shown in FIG. 2, regarding the filter characteristics (alternate long and short dash line) of the preferred embodiment in which no chipping was observed, it is understood that the pass band is significantly widened, as compared with the filter characteristic of the conventional example shown by the continuous line.

In the SAW resonator filter 1, the inner side walls 2$b_1$ and 2$c_1$ of the grooves 2b and 2c constitute the reflection edges. The reflection edges do not reach the lower surface of the surface acoustic wave substrate 2. In the case of an SH type surface acoustic wave, the energy of the surface acoustic wave is great near the upper surface 2a, while that on the lower surface 2f of the surface acoustic wave substrate 2 is very low. Accordingly, even when the inner side walls 2$b_1$ and 2$c_1$ of the grooves 2b and 2c define the reflection edges, most of the energy of the surface acoustic wave is reliably reflected. Thus, the SAW resonator filter 1 is reliably and securely operated as an edge reflection type SAW resonator filter.

In particular, as described above, when the depth of each groove, designated by H, is constructed to satisfy the formula (1), the energy of the surface acoustic wave can be reflected from the inner side walls 2$b_1$ and 2$c_1$ much more effectively. This will be described with reference to FIG. 3.

Figure 3:
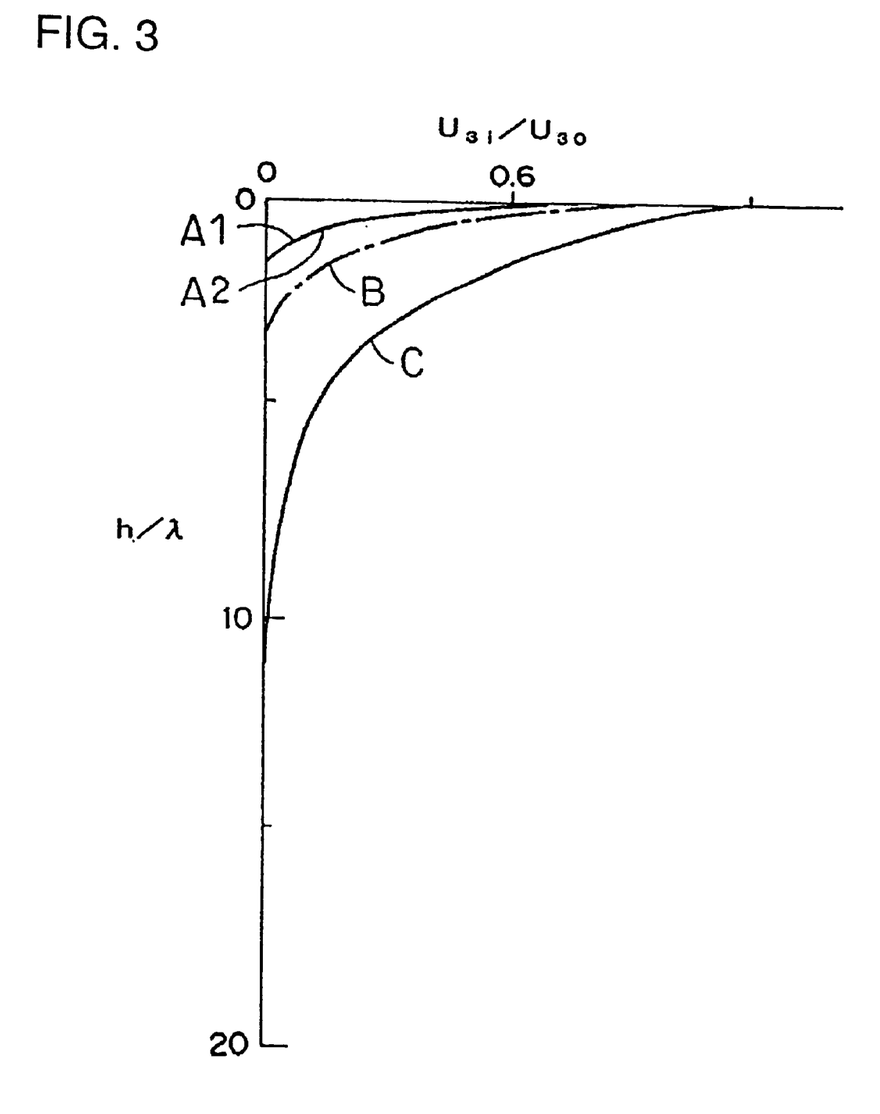
FIG. 3 is a graph showing the relation between a depth $h/\lambda$ from the surface of a surface acoustic wave substrate and the particle displacement of an SH type surface acoustic wave, obtained when IDT is formed on the surface acoustic wave substrate.

FIG. 3 is a graph showing the displacement of the particles of an SH type surface acoustic wave, caused when an IDT is formed on the upper surface of the surface acoustic wave substrate. In FIG. 3, the size obtained by standardizing the depth h from the substrate surface by use of the wave-length λ of the surface acoustic wave, with the upper surface of the surface acoustic wave substrate being set at zero, is plotted as the ordinate of the graph. The displacement $U_{3i}/U_{30}$ of the particles of the SH type surface acoustic wave is plotted as the abscissa of the graph. $U_{3i}$ represents the displacement of the particles inside of the substrate, and $U_{30}$ represents the displacement of the particles on the surface of the substrate. The ratio $U_{3i}/U_{30}$ of the displacements of the particles of the SH type surface acoustic wave is expressed as follows.

$$U_{3i}/U_{30}=\exp(-2\pi k_{15}^2 h/\lambda) \qquad (3)$$

in which $k_{15}$ represents the electromechanical coupling coefficient of thickness shear vibration, h the depth from the surface of a substrate, and λ the wavelength of a surface acoustic wave.

As seen in the formula (3), the displacement $U_{3i}/U_{30}$ of the particles of an SH type surface acoustic wave depends on the electromechanical coupling coefficient $k_{15}$ of a piezoelectric material forming the surface acoustic wave substrate 2. Accordingly, from the results of the formula (3), the SH type particle displacement, caused when the surface acoustic wave substrates made of various piezoelectric materials are used, are graphed, and the graphs are shown in FIG. 3.

Curves A1 and A2 in FIG. 3 show the results obtained when a PZT type piezoelectric ceramic with $k_{15}$ of 61.4% and also, a PZT type piezoelectric ceramic with $k_{15}$ of 63.8% are used as a material constituting the surface acoustic wave substrate 2, respectively.

Curve B represents the results obtained when a PZT type piezoelectric ceramic with $k_{15}$ of 44.3%, and curve C represents the results obtained when a surface acoustic wave substrate ($k_{15}$=25.9%) formed by laminating a ZnO thin film to an insulation substrate is used.

The above-described formula (1) shows that a groove is equal to or deeper than the depth at which the SH type particle displacement is up to 20% of the particle displacement at the surface of a substrate. In this case, most of the energy of the surface acoustic wave is reflected. Even when the depth H of the grooves 2b and 2c is not less than the wavelength λ of a surface acoustic wave, similarly, most of the energy of the surface acoustic wave can be reflected by the inner side walls 2$b_1$ and 2$c_1$.

Accordingly, in the SAW resonator filter 1 of this preferred embodiment, preferably, by forming the grooves 2b and 2c so as to satisfy the formula (1), most of the SH type surface acoustic waves are reliably and securely reflected. In addition, when the grooves 2b and 2c are formed, chipping is prevented and excellent filter characteristics are achieved.

Figure 4:
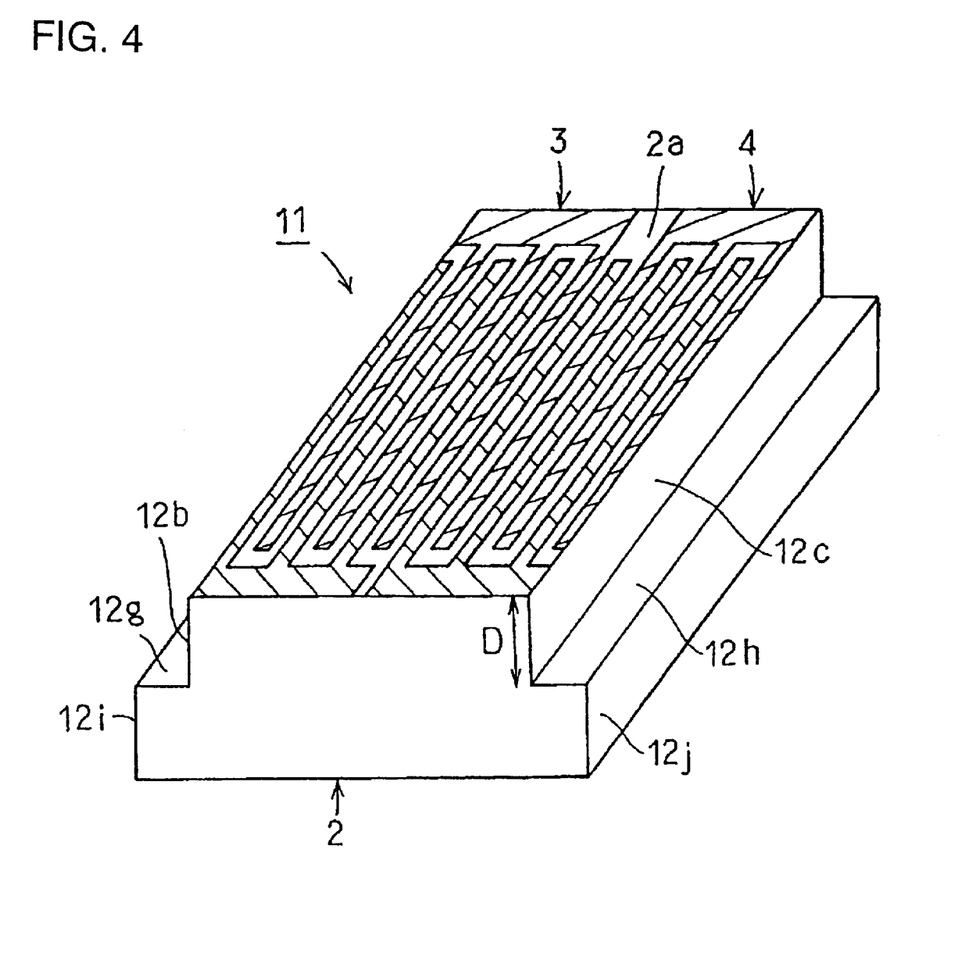
FIG. 4 is a perspective view showing an edge reflection type longitudinally coupled SAW resonator filter according to a second preferred embodiment of the present invention.

FIG. 4 is a perspective view showing an edge reflection type longitudinally coupled type SAW resonator filter according to a second preferred embodiment of the present invention.

The edge reflection type longitudinally coupled SAW resonator filter 11 of the second preferred embodiment is formed similarly to the SAW resonator filter 1 of the first preferred embodiment except that steps 12g and 12h are formed instead of the grooves 2b and 2c. Accordingly, the corresponding parts are designated by the corresponding reference numerals. The description of the corresponding parts will be omitted, since the description of the first preferred embodiment can be applied.

In the SAW resonator filter 11, IDTs 3 and 4 are formed on the upper surface 2a of a surface acoustic wave substrate 2. Edges 12b and 12c for reflecting a surface acoustic wave are provided at the opposite ends in the surface acoustic wave propagation direction of the area where the IDTs 3 and 4 are located. The edges 12b and 12c are positioned above the steps 12g and 12h, respectively. That is, in the SAW resonator filter 11 of this preferred embodiment, the steps 12g and 12h are formed on a pair of the side surfaces on the opposite edges in the surface acoustic wave propagation direction of the surface acoustic wave substrate 12. The portions of the side surfaces located above the steps 12g and 12h are edges 12b and 12c for reflecting a surface acoustic wave, respectively.

Desirably, the sizes in the height direction of the above-described edges 12b and 12c, that is, the distance, represented by D, between the upper surface 2a of a surface acoustic wave substrate 12 and each of the steps 12g and 12h satisfies the formula (2), or is not less than the wavelength λ of the surface acoustic wave.

$$0.2 \geq \exp(-2\pi k_{15}^2 D/\lambda) \quad (2)$$

In the SAW resonator filter 11 of the second preferred embodiment, when the above-described reflection edges 12b and 12c are formed so as to satisfy the formula (2), most of the energy of the surface acoustic wave is reflected from the reflection edges 12b and 12c, similarly to the case where the grooves 2b and 2c of the first preferred embodiment satisfy the formula (1). Accordingly, excellent filter characteristics are achieved.

Further, the steps 12g and 12h are formed, and thereby, the reflection edges 12b and 12c can be formed accurately and easily. This will be described below.

For the purpose of obtaining the SAW resonator filter 11, a flat-plate surface acoustic wave substrate is prepared. On the substrate, the IDTs 3 and 4 are formed. Thereafter, similarly to the first cutting process performed via the step cutting method, a groove with a depth D is formed on the surface acoustic wave substrate beginning from the upper surface thereof via a cutting blade. In this case, the cutting is carried out in such a manner that the groove does not extend to and reach the lower surface of the surface acoustic wave substrate. Therefore, the cutting is done substantially without chipping. Since disconnection of the IDTs 3 and 4 is prevented, excellent filter characteristics are achieved.

The SAW resonator filter 11 can be obtained by forming the above-described grooves, and thereafter, cutting the portions of the substrate which are located below the steps 12g and 12h, via a cutting blade with a relatively narrow width. Further, the steps 12g and 12h may be formed by breaking the bottom portions of the grooves after the grooves having a depth D are formed. Thus, as to the method of forming the. side-face portions 12i and 12j located below the steps 12g and 12h, any method is available for use.

The SAW resonator filters 1 and 11 of the first and second preferred embodiments are longitudinally coupled type SAW resonator filters each having two IDTs arranged to extend in the surface acoustic wave propagation direction. The present invention is not limited to these longitudinally coupled type SAW resonator filters. That is, the present invention can be applied to a transversely coupled SAW resonator filter shown in FIG. 5 or a ladder-type filter shown in FIG. 6.

Figure 5:
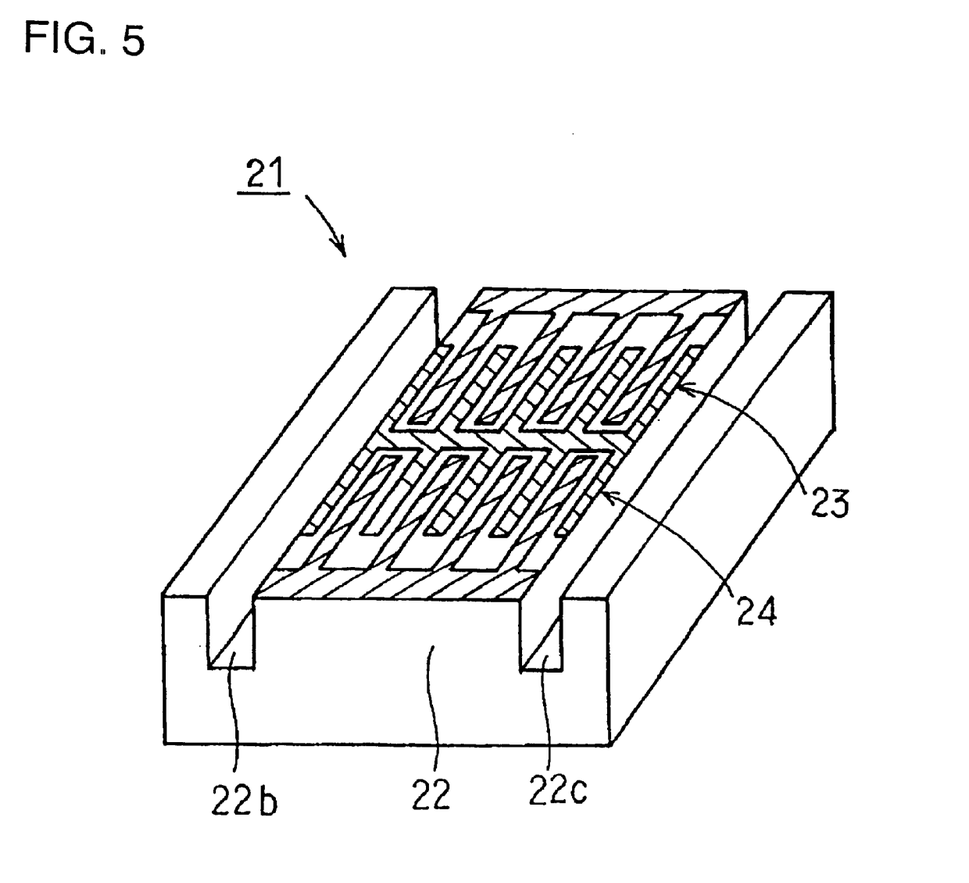
FIG. 5 is a perspective view showing a transversely coupled SAW resonator filter as a modified example of the edge reflection type surface acoustic wave device of the present invention.

In a transversely coupled SAW resonator filter 21 shown in FIG. 5, IDTs 23 and 24 are formed on the upper surface of a surface acoustic wave substrate 22. Hereupon, grooves 22b and 22c are also formed on the opposite ends in the surface acoustic wave propagation direction of the surface acoustic wave substrate 22. Accordingly, excellent filter characteristics are achieved, similarly to the first preferred embodiment.

Figure 6:
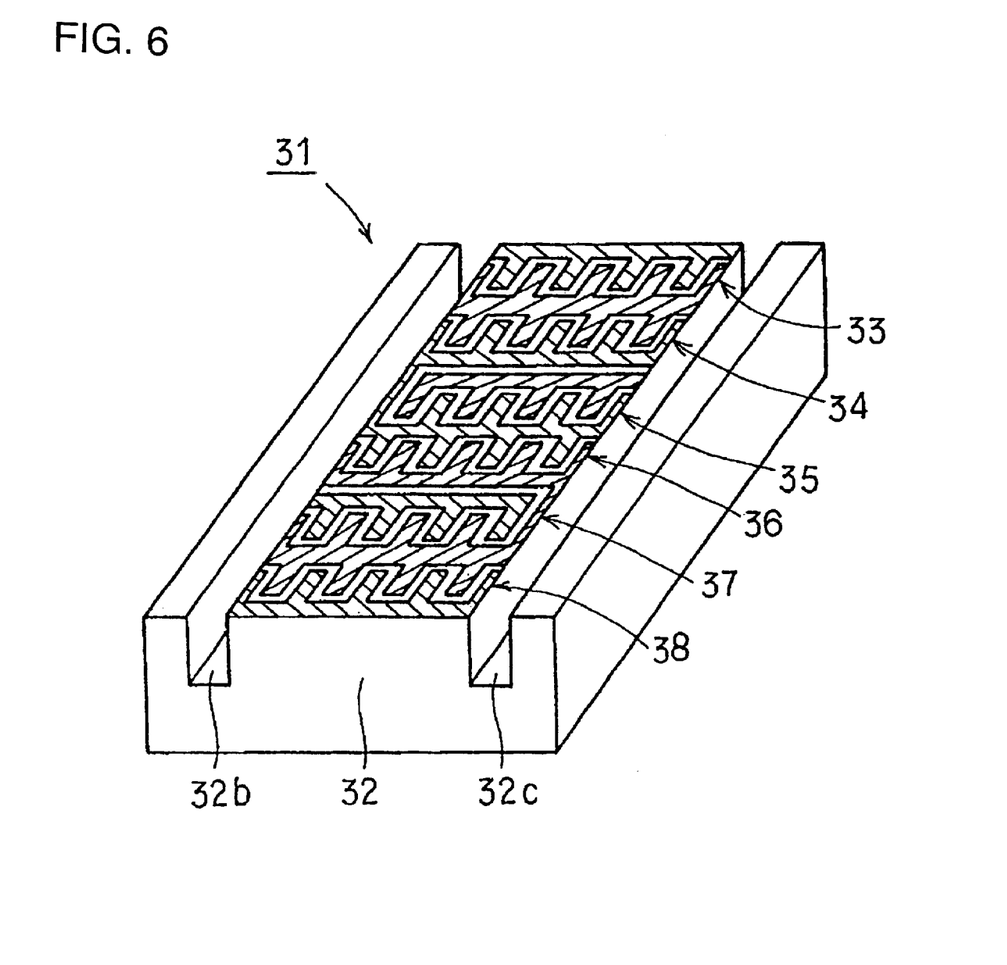
FIG. 6 is a perspective view showing a ladder type filter as another modified example of the edge reflection type surface acoustic wave device of preferred embodiments of the present invention.

As to a ladder type filter 31 shown in FIG. 6, plural IDTs 33 to 38 are formed on the upper surface of a surface acoustic wave substrate 32 so as to define a ladder type filter. Also in this case, grooves 32b and 32c are formed on the opposite ends in the surface acoustic wave propagation direction of the surface acoustic wave substrate 32. Similar to the first preferred embodiment, by selecting the depth of the grooves 32b and 32c, excellent filter characteristics are achieved.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An edge reflection type surface acoustic wave device comprising:

a surface acoustic wave substrate having a first main surface and a second main surface; and at least two interdigital transducers provided on the first surface of the surface acoustic wave substrate; wherein first and second grooves are provided at opposite ends in the surface acoustic wave propagation direction of an area where said at least two interdigital transducers are provided, the first and second grooves extending from the first main surface of the surface acoustic wave substrate toward the second main surface thereof while not reaching the second main surface, the first and second grooves extending substantially perpendicularly to the surface acoustic wave propagation direction, and such that first and second edges which are arranged to reflect the surface acoustic wave are defined by inner side walls of the first and second grooves, respectively;

wherein when $k_{15}$ represents the electromechanical coupling coefficient of thickness shear vibration, and λ the wavelength of the surface acoustic wave, the first and second grooves have a depth H satisfying the following formula (1):

$$0.2 \geq \exp(-2\pi k_{15}^2 H/\lambda) \quad (1).$$

2. An edge reflection type surface acoustic wave device according to claim 1, wherein the surface acoustic wave substrate and the at least two interdigital transducers are arranged to generate a Shear Horizontal type surface acoustic wave.

3. An edge reflection type surface acoustic wave device according to claim 1, further comprising a plurality of resonators having a plurality of interdigital transducers provided on the surface acoustic wave substrate, and a connecting conduction part arranged to electrically connect the plural resonators so as to define a ladder type filter.

4. An edge reflection type surface acoustic wave device according to claim 1, wherein a depth H of the first and second grooves is not less than the wavelength λ of the surface acoustic wave generated therein.

5. A longitudinally coupled type resonator filter comprising the edge reflection type surface acoustic wave device according to claim 1 and a plurality of interdigital transducers arranged on the surface acoustic wave substrate in the surface acoustic wave propagation direction.

6. A transversely coupled resonator filter comprising an edge reflection type surface acoustic wave resonator according to claim 1 and a plurality of interdigital transducers arranged on the surface acoustic wave substrate substantially perpendicularly to the surface acoustic wave propagation direction.

7. A method of forming an edge reflection type surface acoustic wave device which utilizes and SH type surface acoustic wave, comprising the steps of:

providing a surface acoustic wave substrate having a first main surface and a second main surface and first and second side surfaces;

forming at least two interdigital transducers on the surface acoustic wave substrate; and forming a plurality of steps in the first and second side surfaces of the surface acoustic wave substrate which are located on the outer ends in the surface acoustic wave propagation direction of the surface acoustic wave substrate, the steps being positioned at an intermediate height of the first and second side surfaces, respectively, and first and second reflection edges arranged to reflect the surface acoustic wave are defined by the portions of the side surfaces located above the steps in the first and second side surfaces, respectively;

wherein when $k_{15}$ represents the electromechanical coupling coefficient of thickness shear vibration, and $\lambda$ the wavelength of the surface acoustic wave, the first and second edges have a distance D between the first main surface of the surface acoustic wave substrate and each of the steps, which satisfies the following formula (2):

$$0.2 \geq \exp(-2\pi k_{15}^2 D/\lambda) \qquad (2).$$

8. The method according to claim 7, wherein the distance D between the first main surface of the surface acoustic wave substrate and each of the steps is not less than the wavelength $\lambda$ of the surface acoustic wave.

9. An edge reflection type surface acoustic wave device which utilizes an SH type surface acoustic wave, comprising:

a surface acoustic wave substrate having a first main surface and a second main surface and first and second side surfaces; and at least two interdigital transducers provided on the surface acoustic wave substrate; wherein a plurality of steps are provided in the first and second side surfaces of the surface acoustic wave substrate which are located on the outer ends in the surface acoustic wave propagation direction of the surface acoustic wave substrate, and are positioned at an intermediate height of the first and second side surfaces, respectively, and first and second reflection edges arranged to reflect the surface acoustic wave are defined by the portions of the side surfaces located above the steps in the first and second side surfaces, respectively;

wherein when $k_{15}$ represents the electromechanical coupling coefficient of thickness shear vibration, and $\lambda$ the wavelength of the surface acoustic wave, the first and second edges have a distance D between the first main surface of the surface acoustic wave substrate and each of the steps, which satisfies the following formula (2):

$$0.2 \geq \exp(-2\pi k_{15}^2 D/\lambda) \qquad (2).$$

10. An edge reflection type surface acoustic wave device according to claim 9, wherein the distance D between the first main surface of the surface acoustic wave substrate and each of the steps is not less than the wavelength $\lambda$ of the surface acoustic wave.

11. A longitudinally coupled type resonator filter comprising the edge reflection type surface acoustic wave device according to claim 9 and a plurality of interdigital transducers arranged on the surface acoustic wave substrate in the surface acoustic wave propagation direction.

12. A transversely coupled resonator filter comprising an edge reflection type surface acoustic wave resonator according to claim 9 and a plurality of interdigital transducers arranged on the surface acoustic wave substrate substantially perpendicularly to the surface acoustic wave propagation direction.

13. An edge reflection type surface acoustic wave device according to claim 9, further comprising a plurality of resonators having a plurality of interdigital transducers provided on the surface acoustic wave substrate, and a connecting conduction part arranged to electrically connect the plural resonators so as to define a ladder type filter.

14. A method of forming an edge reflection type surface acoustic wave device comprising the steps of:

providing a surface acoustic wave substrate having a first main surface and a second main surface;

forming at least two interdigital transducers on the first surface of the surface acoustic wave substrate; and forming first and second grooves at opposite ends in the surface acoustic wave propagation direction of an area where said at least two interdigital transducers are provided, the first and second grooves extending from the first main surface of the surface acoustic wave substrate toward the second main surface thereof while not reaching the second main surface, the first and second grooves extending substantially perpendicularly to the surface acoustic wave propagation direction, and such that first and second edges which are arranged to reflect the surface acoustic wave are defined by inner side walls of the first and second grooves, respectively;

wherein when $k_{15}$ represents the electromechanical coupling coefficient of thickness shear vibration, and $\lambda$ the wavelength of the surface acoustic wave, the first and second grooves have a depth H satisfying the following formula (1):

$$0.2 \geq \exp(-2\pi k_{15}^2 H/\lambda) \qquad (1).$$

15. The method according to claim 14, wherein the surface acoustic wave substrate and the at least two interdigital transducers are arranged to generate a Shear Horizontal type surface acoustic wave.

16. The method according to claim 14, wherein a depth H of the first and second grooves is not less than the wavelength $\lambda$ of the surface acoustic wave generated therein.

* * * * *